United States Patent
Hashiba et al.

(10) Patent No.: US 12,376,264 B2
(45) Date of Patent: Jul. 29, 2025

(54) COOLING MODULE AND ELECTRONIC APPARATUS

(71) Applicant: LENOVO (SINGAPORE) PTE. LTD., Singapore (SG)

(72) Inventors: Junki Hashiba, Yokohama (JP); Masahiro Kitamura, Yokohama (JP); Shusaku Tomizawa, Yokohama (JP)

(73) Assignee: LENOVO (SINGAPORE) PTE. LTD., Singapore (SG)

(*) Notice: Subject to any disclaimer, the term of this patent is extended or adjusted under 35 U.S.C. 154(b) by 280 days.

(21) Appl. No.: 18/189,193

(22) Filed: Mar. 23, 2023

(65) Prior Publication Data
US 2023/0422446 A1 Dec. 28, 2023

(30) Foreign Application Priority Data
Jun. 24, 2022 (JP) .................. 2022-102223

(51) Int. Cl.
*H05K 7/20* (2006.01)
*G06F 1/20* (2006.01)

(52) U.S. Cl.
CPC ..... *H05K 7/20409* (2013.01); *H05K 7/20336* (2013.01); *G06F 1/203* (2013.01)

(58) Field of Classification Search
CPC ............ H05K 7/20409; H05K 7/20336; G06F 1/203; H01L 23/467
USPC ........................................................ 361/697
See application file for complete search history.

(56) References Cited

U.S. PATENT DOCUMENTS

| | | | | |
|---|---|---|---|---|
| 9,282,275 | B2* | 3/2016 | Yamaguchi | G06F 1/203 |
| 10,775,552 | B2* | 9/2020 | Kobayashi | F21V 29/15 |
| 2005/0073811 | A1* | 4/2005 | Wang | H01L 23/467 |
| | | | | 361/709 |
| 2013/0105121 | A1* | 5/2013 | Xia | H01L 23/3672 |
| | | | | 165/185 |
| 2013/0168058 | A1* | 7/2013 | Chamseddine | F28D 7/0075 |
| | | | | 165/104.26 |
| 2013/0301212 | A1* | 11/2013 | Yang | H01L 23/467 |
| | | | | 165/185 |
| 2014/0083655 | A1* | 3/2014 | Wang | F28F 7/00 |
| | | | | 165/121 |

FOREIGN PATENT DOCUMENTS

| | | | |
|---|---|---|---|
| JP | 09210583 A | 8/1997 |
| JP | 2005064039 A | 3/2005 |

(Continued)

*Primary Examiner* — Jayprakash N Gandhi
*Assistant Examiner* — Kyle Oxenknecht
(74) *Attorney, Agent, or Firm* — SHIMOKAJI IP

(57) ABSTRACT

A cooling module includes a fan, a heat sink, and a first heat pipe and a second heat pipe that are connected to a first surface of the heat sink. The heat sink includes a valley portion in which the second surface is recessed toward a side of the first surface, a first mountain portion that is between the valley portion and the air introduction surface and has a greater height of the fin than the valley portion, and a second mountain portion that is between the valley portion and the air exhaust surface and has a greater height of the fin than the valley portion. The first mountain portion is disposed at a position overlapping the first heat pipe, and the second mountain portion is disposed at a position overlapping the second heat pipe.

7 Claims, 6 Drawing Sheets

(56) References Cited

FOREIGN PATENT DOCUMENTS

| | | | |
|---|---|---|---|
| JP | 3142012 U | 5/2008 | |
| JP | 3177121 U | 7/2012 | |
| JP | 2022059833 A | 4/2022 | |
| WO | WO-2019189726 A1 * | 10/2019 | ......... F28D 15/0275 |

* cited by examiner

COOLING MODULE AND ELECTRONIC APPARATUS

BACKGROUND OF THE INVENTION

Field of the Invention

The present invention relates to a cooling module and an electronic apparatus including the cooling module.

Description of the Related Art

An electronic apparatus, such as a laptop PC, is equipped with a cooling module for cooling a heating element, such as a CPU or the like (see, for example, Japanese Unexamined Patent Application Publication No. 2022-059833). Such a cooling module has a configuration in which a heat pipe that absorbs and transports the heat generated by the CPU or the like, and a heat sink and a fan that exhaust the heat transported by the heat pipe to an outside of a chassis are provided.

SUMMARY OF THE INVENTION

In order to improve the system performance in the above-described electronic apparatus, it is important to raise the heat exhausting capacity of the cooling module to extend a boost operation time of the CPU. As one of the methods of raising the heat exhausting capacity, it is conceivable to improve an exhaust air volume passing through the heat sink. In order to improve the exhaust air volume, a method of reducing the ventilation resistance between fins constituting the heat sink can be considered.

However, as in the configuration of Japanese Unexamined Patent Application Publication No. 2022-059833, in the heat sink to which the two heat pipes are connected, a length of the fin in a flow direction of air has to be increased, and it is difficult to reduce the ventilation resistance. Therefore, in such a heat sink, it is conceivable to reduce a surface area of the fin itself, thereby reducing the ventilation resistance. However, in a case in which the surface area of the fin is simply reduced, the surface area of the fin that receives the heat from the heat pipe is insufficient, the heat transfer efficiency from the heat pipe to the fin is decreased, and the heat transfer from each heat pipe to the heat sink is not equalized. As a result, there is a possibility that the cooling performance of the entire cooling module is decreased.

The present invention has been made in view of the above problems of the prior art, and is to provide a cooling module and an electronic apparatus including the cooling module capable of improving the cooling performance by reducing the ventilation resistance of the heat sink while ensuring the heat transfer efficiency from the heat pipe to the fin.

A first aspect of the present invention relates to a cooling module mounted on an electronic apparatus, the cooling module including a fan including an intake port and an exhaust port, a heat sink including a plurality of fins arranged with a gap between the fins, and an air introduction surface and an air exhaust surface that intersect a first surface on one side and a second surface on the other side in an upright direction of each fin, in which the air introduction surface is disposed to face the exhaust port, and a first heat pipe and a second heat pipe that are connected to the first surface of the heat sink and are arranged along a flow direction of air in the heat sink from the air introduction surface toward the air exhaust surface, in which the heat sink includes a valley portion in which the second surface is recessed toward a side of the first surface, a first mountain portion that is provided between the valley portion and the air introduction surface and has a greater height of the fin than the valley portion, and a second mountain portion that is provided between the valley portion and the air exhaust surface and has a greater height of the fin than the valley portion, and as viewed in a direction in which the heat sink, the first heat pipe, and the second heat pipe are laminated, the first mountain portion is disposed at a position overlapping the first heat pipe, and the second mountain portion is disposed at a position overlapping the second heat pipe.

A second aspect of the present invention relates to a cooling module mounted on an electronic apparatus, the cooling module including a fan including an intake port and an exhaust port, a heat sink including a plurality of fins arranged with a gap between the fins, and an air introduction surface and an air exhaust surface that intersect a first surface on one side and a second surface on the other side in an upright direction of each fin, in which the air introduction surface is disposed to face the exhaust port, and a first heat pipe and a second heat pipe that are connected to the first surface of the heat sink and are arranged along a flow direction of air in the heat sink from the air introduction surface toward the air exhaust surface, in which the heat sink includes a notch portion that is formed such that a corner portion of the fin between the air introduction surface and the second surface is notched, and a valley portion that is provided at a position overlapping a boundary line between the first heat pipe and the second heat pipe as viewed in a direction in which the heat sink, the first heat pipe, and the second heat pipe are laminated, in which the fin is recessed in a valley shape from a side of the second surface toward a side of the first surface.

A third aspect of the present invention relates to an electronic apparatus including a chassis, a heating element that is provided in the chassis, and a cooling module that is provided in the chassis and absorbs heat generated by the heating element, in which the cooling module includes a fan including an intake port and an exhaust port, a heat sink including a plurality of fins arranged with a gap between the fins, and an air introduction surface and an air exhaust surface that intersect a first surface on one side and a second surface on the other side in an upright direction of each fin, in which the air introduction surface is disposed to face the exhaust port, and a first heat pipe and a second heat pipe that are connected to the first surface of the heat sink and are arranged along a flow direction of air in the heat sink from the air introduction surface toward the air exhaust surface, the heat sink includes a valley portion in which the second surface is recessed toward a side of the first surface, a first mountain portion that is provided between the valley portion and the air introduction surface and has a greater height of the fin than the valley portion, and a second mountain portion that is provided between the valley portion and the air exhaust surface and has a greater height of the fin than the valley portion, and as viewed in a direction in which the heat sink, the first heat pipe, and the second heat pipe are laminated, the first mountain portion is disposed at a position overlapping the first heat pipe, and the second mountain portion is disposed at a position overlapping the second heat pipe.

The above-described aspects of the present invention can improve the cooling performance by reducing the ventilation resistance of the heat sink while ensuring the heat transfer efficiency from the heat pipe to the fin.

DETAILED DESCRIPTION OF THE INVENTION

Hereinafter, a cooling module and an electronic apparatus according to the present invention will be described in detail with reference to a preferred embodiment with reference to the accompanying drawings.

Figure 1:
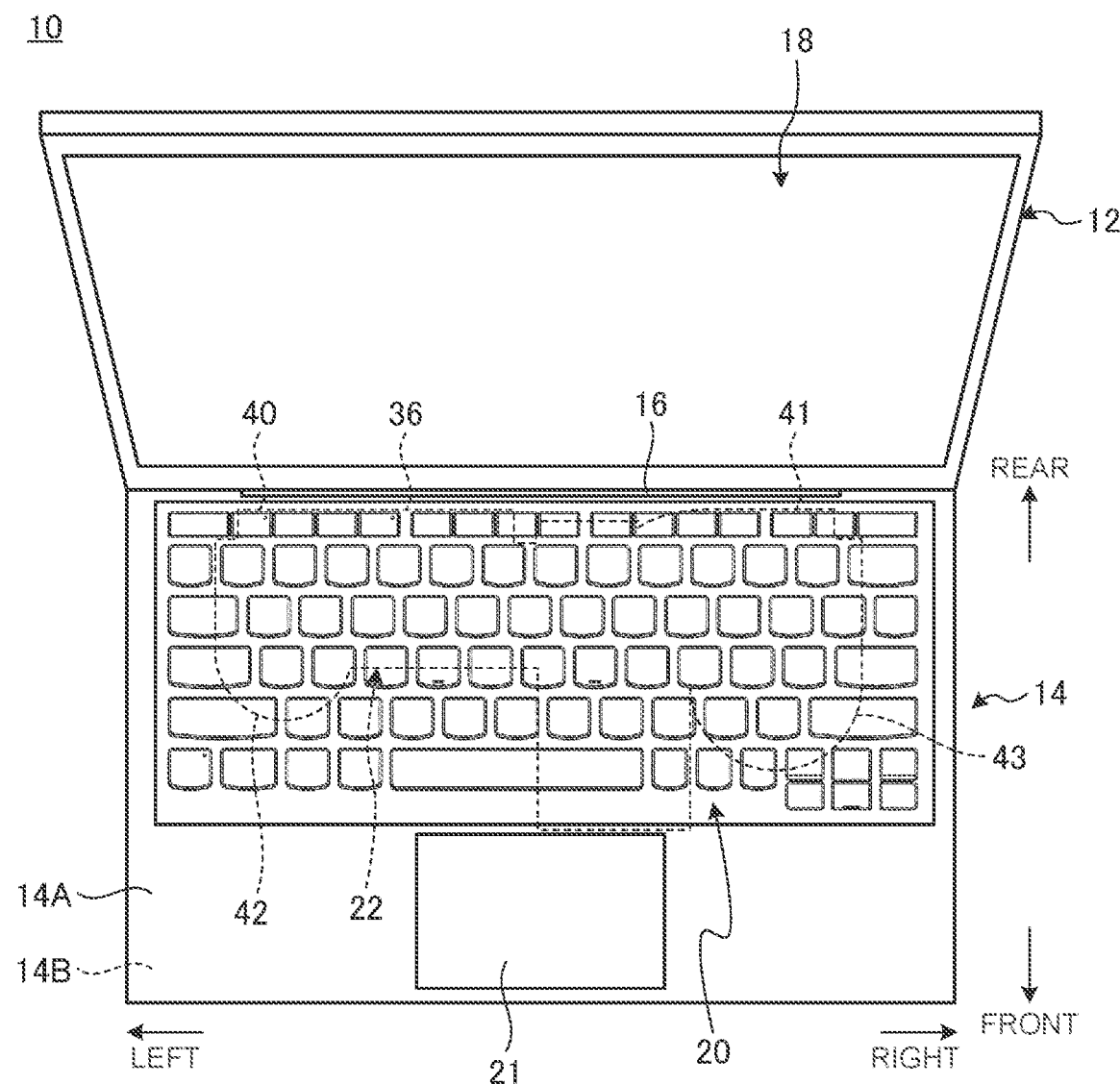
FIG. 1 is a schematic plan view of an electronic apparatus according to an embodiment as viewed from above.

FIG. 1 is a schematic plan view of an electronic apparatus 10 according to the embodiment as viewed from above. As illustrated in FIG. 1, the electronic apparatus 10 is a clamshell-shaped laptop PC in which a display chassis 12 and a chassis 14 are coupled to be relatively rotatable, by a hinge 16. The electronic apparatus according to the present invention may be, for example, a desktop PC, a tablet PC, a smartphone, a game machine, or the like, in addition to the laptop PC.

The display chassis 12 is a thin flat box body. A display 18 is mounted on the display chassis 12. The display 18 includes, for example, an organic EL (organic light emitting diode, OLED) or a liquid crystal.

Hereinafter, with respect to the chassis 14 and each element mounted on the chassis 14, the description will be made by setting a space between the chassis 12 and 14 to be in an open state as illustrated in FIG. 1, using a posture of visually recognizing the display 18 as a reference, referring a front side to as front, referring a rear side to as rear, referring a width direction to as left and right, and referring a height direction (thickness direction of the chassis 14) to as top and bottom.

The chassis 14 is a thin flat box body. The chassis 14 includes a cover member 14A that forms an upper surface and four peripheral side surfaces, and a cover member 14B that forms a lower surface. The cover member 14A on the top side has a substantially bathtub shape with a lower surface open. The cover member 14B on the bottom side has a substantially flat plate shape and serves as a lid that closes the lower surface opening of the cover member 14A. The cover members 14A and 14B overlap each other in the thickness direction and are detachably coupled to each other. A keyboard 20 and a touch pad 21 are provided on the upper surface of the chassis 14. A rear end portion of the chassis 14 is coupled to the display chassis 12 by using the hinge 16.

Figure 2:
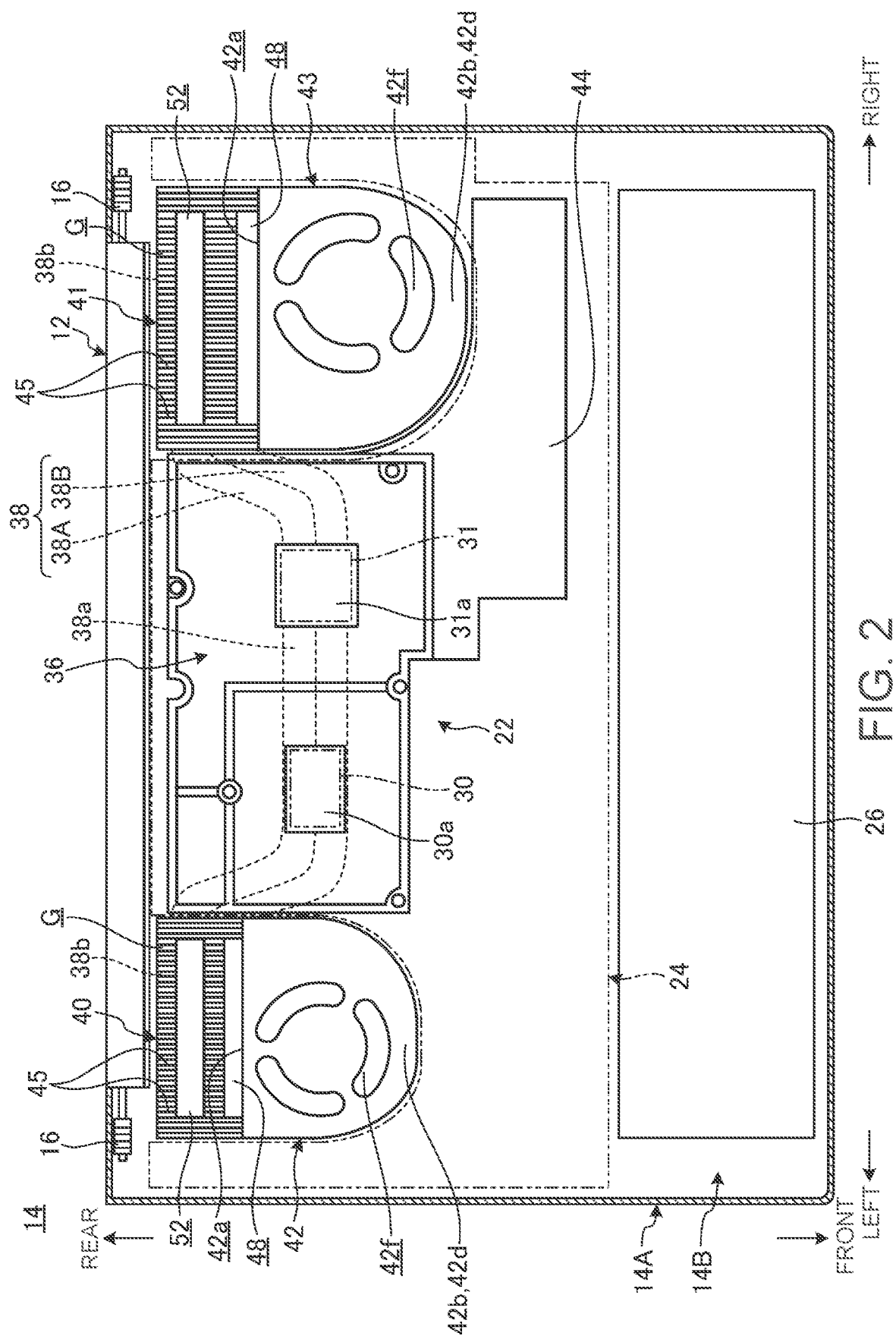
FIG. 2 is a plan view schematically illustrating an internal structure of a chassis.

FIG. 2 is a plan view schematically illustrating an internal structure of the chassis 14, and is a schematic plan cross-sectional view of the chassis 14 cut slightly below the keyboard 20.

As illustrated in FIG. 2, a cooling module 22, a motherboard 24, and a battery device 26 are provided inside the chassis 14. Various electronic components, mechanical components, and the like are further provided inside the chassis 14.

The motherboard 24 is a main board of the electronic apparatus 10. The motherboard 24 is disposed near the rear of the chassis 14 and extends along the left-right direction. The motherboard 24 is a printed board on which various electronic components, such as a power component, a communication module, a memory, and a connection terminal, and the like, are mounted in addition to a CPU 30 and a GPU 31. The motherboard 24 is disposed below the keyboard 20 and is screwed to a rear surface of the keyboard 20 or an inner surface of the cover member 14A. The motherboard 24 has an upper surface that serves as an attachment surface with respect to the cover member 14A, and a lower surface that serves as a mounting surface with respect to the CPU 30 and the like.

The CPU 30 is disposed on the left side of the center on the left and right of the mounting surface of the motherboard 24. The CPU 30 performs computing related to main control or processing of the electronic apparatus 10. The GPU 31 is arranged on the right side of the CPU 30 on the mounting surface of the motherboard 24. The GPU 31 performs computing necessary for image depiction, such as 3D graphics or the like.

The battery device 26 is a rechargeable battery that serves as a power source of the electronic apparatus 10. The battery device 26 is disposed in front of the motherboard 24 and extends to the left and right along a front end portion of the chassis 14.

Hereinafter, a configuration of the cooling module 22 will be described.

The CPU 30 and the GPU 31 are heating elements having the largest calorific value among the electronic components mounted in the chassis 14. Therefore, the cooling module 22 absorbs and diffuses the heat generated by the CPU 30 and the GPU 31, and further exhausts the heat to the outside of the chassis 14. The cooling module 22 is laminated to cover a part of the mounting surface of the motherboard 24, for example.

As illustrated in FIG. 2, the cooling module 22 includes a vapor chamber 36, a heat pipe 38, a pair of left and right heat sinks 40 and 41, a pair of left and right fans 42 and 43, and a heat conductive plate 44.

The vapor chamber 36 is a plate-shaped heat transport device. The vapor chamber 36 forms a closed space between two thin metal plates, and a working fluid is enclosed in the closed space. The metal plate is made of a metal having high heat conductivity, such as aluminum, copper, or stainless steel. The closed space serves as a flow path through which the enclosed working fluid flows while causing a phase change. Examples of the working fluid include water, alternative for chlorofluorocarbon, acetone, butane, and the like. A wick that delivers the condensed working fluid by a capillary phenomenon is disposed in the closed space. The wick is made of, for example, a porous body, such as a mesh obtained by knitting a fine metal wire into a cotton shape, a fine flow path, or the like.

The vapor chamber 36 can absorb and diffuse the heat of the CPU 30 and the GPU 31, and transfer the heat to the heat pipe 38 connected to a lower surface. Reference numerals 30$a$ and 31$a$ in FIG. 2 are heat receiving plates interposed between an upper surface of the vapor chamber 36 and top surfaces of the CPU 30 and the GPU 31, respectively, and are copper plates, for example.

The heat pipe 38 is a pipe-shaped heat transport device. In the present embodiment, a configuration is illustrated in which a set of two heat pipes 38A and 38B is arranged in parallel in the front-rear direction, and both end portions thereof are connected to the left and right heat sinks 40 and 41. The heat pipes 38A and 38B have a configuration in which a metal pipe is thinly and flatly crushed and is formed to have an elliptical-shaped cross section, and the working fluid is enclosed in the closed space formed in the metal pipe. The materials and configurations of the metal pipe, the closed space, the working fluid, and the wick constituting the heat pipe 38 may be the same as or similar to the materials and configurations of the metal plate, the closed space, the working fluid, and the wick constituting the vapor chamber 36.

In the heat pipe 38 according to the present embodiment, the vicinity of the center is curved to the front side, is formed in a substantially U shape in a plan view, and extends in the left-right direction. A central portion 38a of the heat pipe 38 is connected to the lower surface of the vapor chamber 36 at a position overlapping the CPU 30 and the GPU 31 in the top-bottom direction. In the heat pipe 38, a first end portion 38b is connected to a lower surface of the heat sink 40, and a second end portion 38c is connected to a lower surface of the heat sink 41. Three or more heat pipes 38 may be used. A configuration or the like may be adopted in which, for example, two sets of a set of two heat pipes 38 are provided, one set is connected to the heat sink 40, and the other set is connected to the heat sink 41.

The left and right heat sinks 40 and 41 have substantially symmetrical structures, although the sizes, heat exchange areas, or the like are slightly different from each other. Similarly, the left and right fans 42 and 43 also have substantially symmetrical structures. Therefore, hereinafter, the heat sink 40 and the fan 42 on the left side will be mainly described, the heat sink 41 and the fan 43 on the right side will be given the same reference numerals as the heat sink 40 and the fan 42 on the left side, and the detailed description thereof will be omitted. In addition, the fans 42 and 43 and the heat sinks 40 and 41 may be configured by only one of a left and right pair, not by a left and right pair.

The heat sink 40 has a structure in which a plurality of plate-shaped fins 45 that extend along the front-rear direction and stand upright in the top-bottom direction are arranged at equal intervals in the left-right direction. A gap G through which air delivered from the fan 42 passes is formed between the adjacent fins 45 and 45. Therefore, the gap G penetrates in the front-rear direction, and a plurality of gaps G are arranged in the left-right direction.

Each of the fins 45 is, for example, a metal plate having a substantially U-shaped cross section formed with a plate piece bent at a right angle in the same direction on the upper and lower end surfaces. Each of the fins 45 is made of a metal having a high heat conductivity, such as copper or aluminum. The heat sink 40 has, for example, a configuration in which the metal plates (fins 45) provided with the bent portions at the upper and lower end portions are laminated in a plate thickness direction with the gap G there between and joined to each other by welding (see FIG. 3). The heat sink 40 may have a configuration other than the above-described configuration, and need only have a configuration in which a plurality of fins 45 are arranged with the gap G there between.

The fan 42 is disposed in front of the heat sink 40, and an exhaust port 42a open rearward is disposed to face a front surface of the heat sink 40. The fan 42 is a centrifugal fan that rotates an impeller portion 42c (see FIG. 5) accommodated inside a fan chassis 42b by a motor. The fan 42 includes a cover plate 42d that forms an upper surface and a side surface and a cover plate 42e that forms a lower surface, and intake ports 42f and 42g are open in the cover plates 42d and 42e, respectively. One of the intake ports 42f and 42g may be omitted.

The heat conductive plate 44 is coupled to a front edge portion of the vapor chamber 36 and protrudes forward. The heat conductive plate 44 is a thin plate made of a metal, such as aluminum, copper, or the like, or a material having high heat conductivity, such as graphite or the like. The heat conductive plate 44 is provided to cover, for example, the power component mounted on the motherboard 24.

Hereinafter, a specific configuration example of the heat sink 40 (41) will be described.

Figure 3:
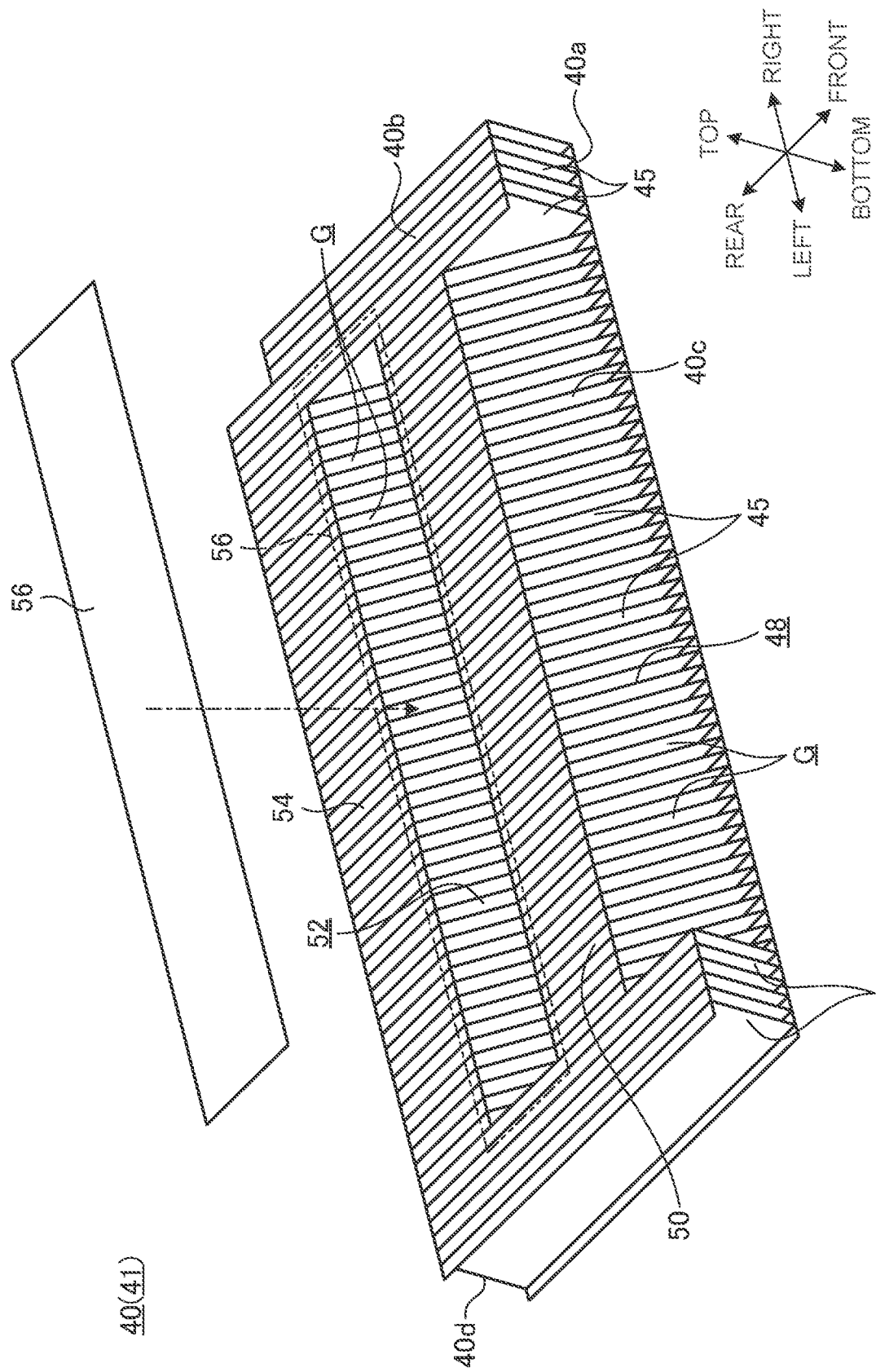
FIG. 3 is a perspective view of a heat sink as viewed from above.
Figure 4:
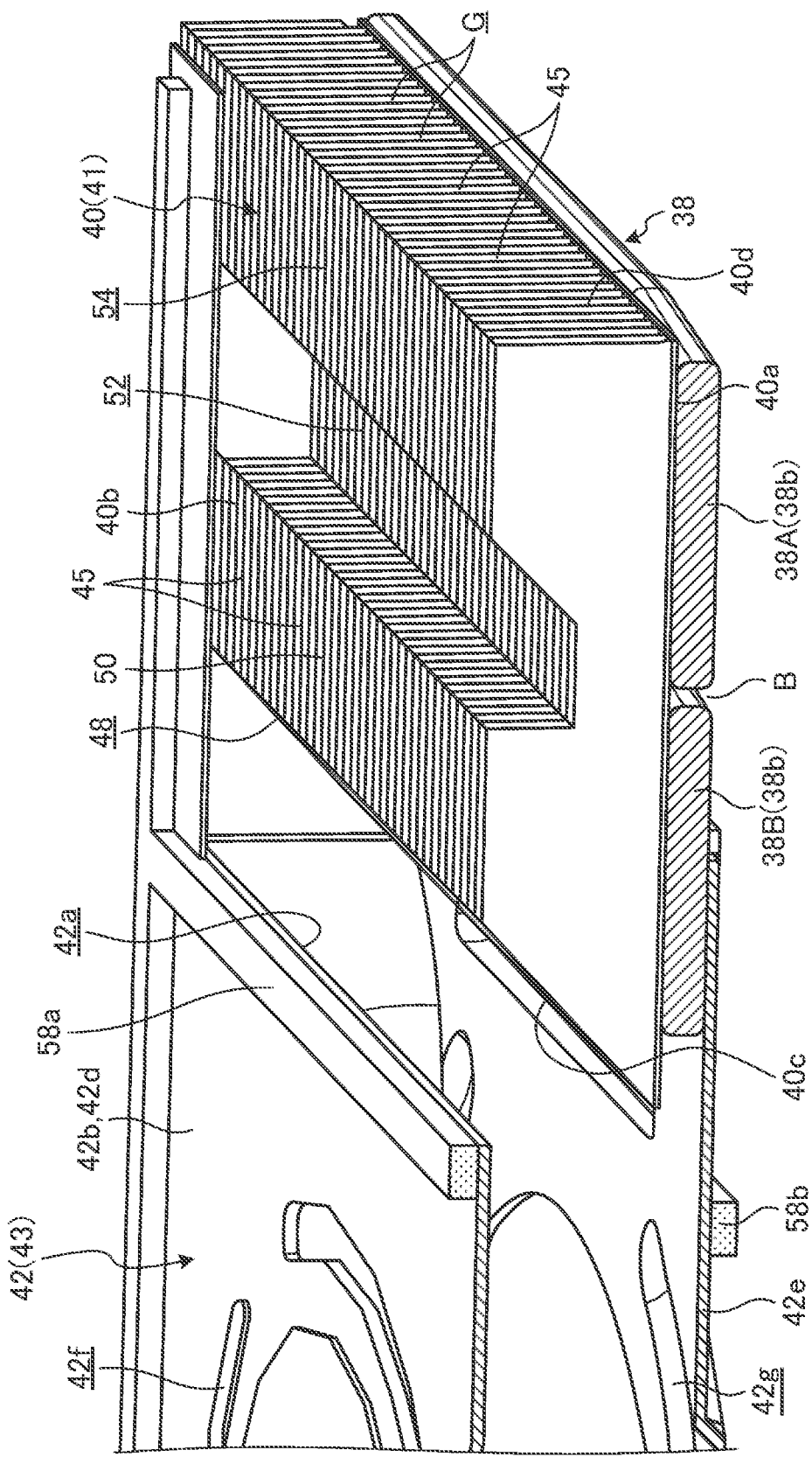
FIG. 4 is an enlarged perspective sectional view of the heat sink and a peripheral portion thereof.
Figure 5:
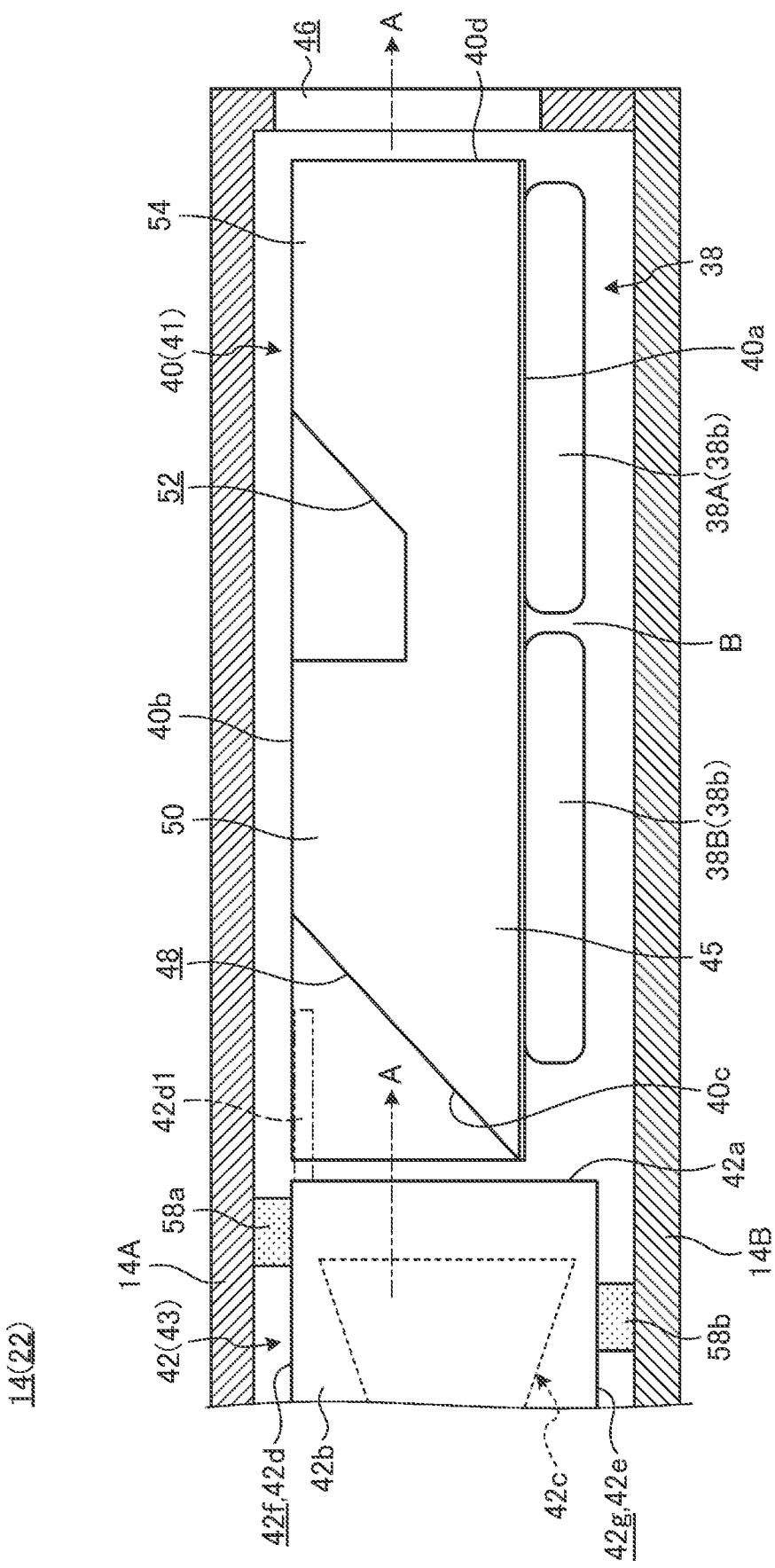
FIG. 5 is an enlarged side sectional view of the heat sink and the peripheral portion thereof.

FIG. 3 is a perspective view of the heat sink 40 (41) as viewed from above. FIG. 4 is an enlarged perspective sectional view of the heat sink 40 (41) and a peripheral portion thereof. FIG. 5 is an enlarged side sectional view of the heat sink 40 (41) and the peripheral portion thereof.

As illustrated in FIGS. 2 to 5, each gap G of the heat sink 40 extends in the front-rear direction between the lower surface (first surface 40a) and the upper surface (second surface 40b) parallel to the lower surface, and the gaps G are arranged in the left-right direction to form an air flow path.

The front and rear side surfaces of the heat sink 40 that intersect the first surface 40a and the second surface serve as an air introduction surface 40c and an air exhaust surface 40d, respectively. The air introduction surface 40c faces the exhaust port 42a of the fan 42, and serves as an inlet for air delivered from the fan 42. The air exhaust surface 40d faces an opening portion 46 formed in a rear edge portion of the chassis 14, and serves as an outlet for air A that has passed through the heat sink 40.

As illustrated in FIGS. 3 to 5, the heat sink 40 includes a notch portion 48, a first mountain portion 50, a valley portion 52, and a second mountain portion 54 that are arranged in order along the flow direction of air from the air introduction surface 40c toward the air exhaust surface 40d.

The notch portion 48 is formed such that a corner portion between the air introduction surface 40c and the second surface 40b is notched, and has a chamfered shape. The notch portion 48 is formed at the corner portions of the remaining fins 45 except for several fins 45 on both left and right end sides in the width direction of the heat sink for example, about 1 to 5 fins 45. The notch portion 48 according to the present embodiment has a shape in which the fins 45 are cut diagonally, and is gradually inclined from the air introduction surface 40c side to the air exhaust surface 40d side from the first surface 40a toward the second surface 40b. The notch portion 48 may be formed at a height that does not reach the first surface 40a, similarly to the valley portion 52.

The first mountain portion 50 is a portion in which each of the fins 45 stands upright to the maximum height between the notch portion 48 and the valley portion 52. The second mountain portion 54 is a portion in which each of the fins 45 stands upright to the maximum height between the valley portion 52 and the air exhaust surface 40d. Each of the mountain portions 50 and 54 is formed in a mountain shape having a substantially trapezoidal shape as viewed from the side. In the mountain portions 50 and 54, each of the fins stands upright from the first surface 40a to the second surface 40b, and has a maximized surface area. In the mountain portions 50 and 54, the fin 45 does not always stand upright to the maximum height between the first surface 40a and the second surface 40b. For example, the height of the fin 45 may be lower in the second mountain portion 54 than in the first mountain portion 50, and vice versa. That is, the height of each of the fin 45 need only be formed to be greater in the mountain portions 50 and 54 than in the valley portion 52 between the recess-shaped valley portion 52 and the surfaces 40c and 40d, respectively. It should be noted that, in the present embodiment, since the height of the fin in the mountain portions 50 and 54 is set to the maximum height between the surfaces 40a and 40b, the surface area of each of the fins 45 is expanded as described above, and there is an advantage that the heat exchange performance is further improved.

The valley portion 52 is a portion in which the height of each of the fins 45 is formed to be low between the first mountain portion 50 and the second mountain portion 54, and has a shape in which the second surface 40b is recessed in a valley shape in a substantially trapezoidal shape toward the first surface 40a side. Similarly, to the notch portion 48, the valley portion 52 is also formed on the second surface 40b side of the remaining fins 45 except for several fins 45 on both left and right end sides in the width direction of the heat sink 40. The valley portion 52 according to the present embodiment is recessed vertically downward from a downstream end portion of the first mountain portion 50 in the flow direction of air in the heat sink 40, has a valley bottom extending toward the downstream side, and then is inclined from the air introduction surface 40c side to the air exhaust surface 40d from the first surface toward the second surface 40b.

In such a heat sink 40 (41), the first mountain portion 50 is disposed at a position vertically overlapping one heat pipe 38A, and the second mountain portion 54 is disposed at a position vertically overlapping the other heat pipe 38B.

As described above, in the cooling module 22 according to the present embodiment, the two heat pipes 38A and 38B arranged along the flow direction of air are connected to the first surface 40a of the heat sink 40 (41). That is, the heat sink 40 (41) has a large length from the air introduction surface 40c to the air exhaust surface 40d in order to connect the two heat pipes 38A and 38B. Therefore, the heat sink 40 (41) has a long air flow path, and there is a concern that the ventilation resistance is increased. Therefore, in the heat sink 40 (41) according to the present embodiment, the notch portion 48 and the valley portion 52 are provided in order between the air introduction surface 40c and the air exhaust surface 40d. As a result, the heat sink 40 (41) can reduce the ventilation resistance between each of the fins 45, and can increase the exhaust air volume from the fan 42 (43).

Also, the heat sink 40 (41) according to the present embodiment has the mountain portions 50 and 54 of which the surface area is expanded by protruding each of the fins 45 to be higher than the valley portion 52. Then, as viewed in a direction in which the heat sink 40 (41) and the heat pipes 38A and 38B are laminated, these mountain portions 50 and 54 are disposed at positions overlapping the two heat pipes 38A and 38B, respectively. In other words, the valley portion 52 provided between the mountain portions 50 and 54 is disposed at a position vertically overlapping a boundary portion B between the two heat pipes 38A and 38B.

Therefore, the heat sink 40 (41) can avoid the surface area of the fin 45 directly above the heat pipes 38A and 38B from being insufficient while reducing the ventilation resistance by the notch portion 48 and the valley portion 52. As a result, the cooling module 22 can equalize the heat transfer from the heat pipes 38A and 38B to each of the fins 45 of the heat sink 40 (41), and can suppress the decrease in the heat transfer efficiency.

As described above, the cooling module 22 according to the present embodiment can ensure high heat transfer efficiency from the two heat pipes 38A and 38B to each of the fins 45 while reducing the ventilation resistance in the heat sink 40 (41). As a result, in the cooling module 22, the heat exhausting capacity of the heat from the CPU 30 and the like transported by the heat pipes 38A and 38B in the heat sink 40 (41) is improved, and the cooling performance is improved.

It is desirable that the notch portion 48 and the valley portion 52 can suppress air leakage from an upper opening thereof to some extent. This suppression is to prevent an air flow rate in the heat sink 40 (41) from being excessively decreased. Here, the upper opening of the notch portion 48 can be easily closed by, for example, an extension portion 42d1 in which the cover plate 42d of the fan chassis 42b is extended (see FIG. 5). On the other hand, the upper opening of the valley portion 52 may be closed by attaching, for example, a cover member 56 straddling the valley portion 52 to the mountain portions 50 and 54 (see FIG. 3). In a case in which the cover member 56 is made of a sheet material having heat conductivity, such as a graphite sheet, a copper sheet, or the like, the heat exhausting capacity of the heat sink 40 (41) is improved.

Reference numerals 58a and 58b in FIG. 5 are airtight materials that are provided to surround outer peripheral edge portions of the upper and lower surfaces of the fan chassis 42b and to prevent backflow of exhaust air to the intake ports 42f and 42g, and are sponges, for example.

Hereinafter, an experimental result of comparison of the cooling performance between the electronic apparatus 10 according to the embodiment including the heat sinks 40 and 41 in which the notch portion 48 and the valley portion 52 are provided and an electronic apparatus according to a comparative example including a heat sink in which the valley portion 52 is removed from the heat sinks 40 and 41 will be described with reference to Table 1. In addition, the electronic apparatus according to the comparative example has the same configuration as the electronic apparatus 10 according to the embodiment except that the heat sinks 40 and 41 do not include the valley portion 52.

In Table 1, the column of "only notch portion" indicates the experimental result of the electronic apparatus according to the comparative example in which the valley portion 52 is not provided, and the column of "notch portion+valley portion" indicates the experimental result of the electronic apparatus according to the embodiment in which the valley portion 52 is provided. In the column of "air flow rate (CFM)", the column of "first fan" indicates a measurement result of an air volume of the fan 42, and the column of "second fan" indicates a measurement result of an air volume of the fan 43. The column of "CPU temperature (° C.)" indicates a measurement result of a surface temperature of the CPU 30, and the column of "GPU temperature (° C.)" indicates a measurement result of a surface temperature of the GPU 31. In the column of "chassis surface temperature (° C.)", the column of "keyboard surface" indicates a measurement result of a surface temperature of the keyboard 20, the column of "chassis upper surface" indicates a measurement result of an upper surface temperature of the chassis 14, and the column of "chassis lower surface" indicates a measurement result of a lower surface temperature of the chassis 14. The column of "heat sink volume (mm³)" indicates the total volume of the two heat sinks 40 and 41.

As illustrated in Table 1, as a result of the present experiment, in the column of "notch portion+valley portion" according to the embodiment, the air volume of each of the fans 42 and 43 is increased and the surface temperatures of the upper and lower surfaces of the chassis 14 is decreased as compared with the column of "only notch portion" according to the comparative example. It is considered that this result is because the heat sinks 40 and 41 have the valley portion 52 in addition to the notch portion 48 in the electronic apparatus 10 according to the embodiment, so that the ventilation resistance thereof is reduced and the exhaust air volumes of the fans 42 and 43 are improved.

As described above, it is confirmed that, in the electronic apparatus 10 according to the embodiment, the surface temperature of the chassis 14 can be decreased as compared with the electronic apparatus according to the comparative example, and thus the boost operation time of the CPU 30 can be extended and the performance can be improved. Also, in the electronic apparatus 10 according to the embodiment, since the valley portion 52 is formed, the volume, that is, the weight of the heat sink 40 (41) can be reduced by about 21%, which also contributes to the weight reduction of the chassis 14.

In addition, in Table 1, the surface temperatures of the CPU 30 and the GPU 31 according to the embodiment are higher than the surface temperatures in the comparative example. It is considered that this result is because, in the heat sinks 40 and 41 according to the embodiment, the heat radiation capacity of the heat pipe 38 is decreased as much as the surface area of the fin 45 is decreased by the valley portion 52, as compared with the heat radiation capacity in the comparative example. It should be noted that, as described above, in the configuration according to the embodiment, since the surface temperature of the chassis 14 is decreased, the problem that the user experience is not decreased even in a case in which the performance of the CPU 30 is improved is unlikely to occur, and as a result, there is an effect that the boost operation time of the CPU 30 can be extended.

TABLE 1

|  |  | Only notch portion | Notch portion + valley portion |
|---|---|---|---|
| Air flow rate (CEM) | First fan | 1.72 | 1.9 (+10.4%) |
|  | Second fan | 2.94 | 3.15 (+7.1%) |
|  | CPU temperature (° C.) | 76.0 | 77.9 (+1.9) |
|  | GPU temperature (° C.) | 75.1 | 77.4 (+1.7) |
| Chassis surface temperature (° C.) | Keyboard surface | 47.8 | 47.8 |
|  | Chassis upper surface | 51.7 | 49.3 (−2.4) |
|  | Chassis lower surface | 50.5 | 47.8 (−2.7) |
| Heat sink volume (mm³) |  | 1440 | 1276 (−21%) |

Figure 6:
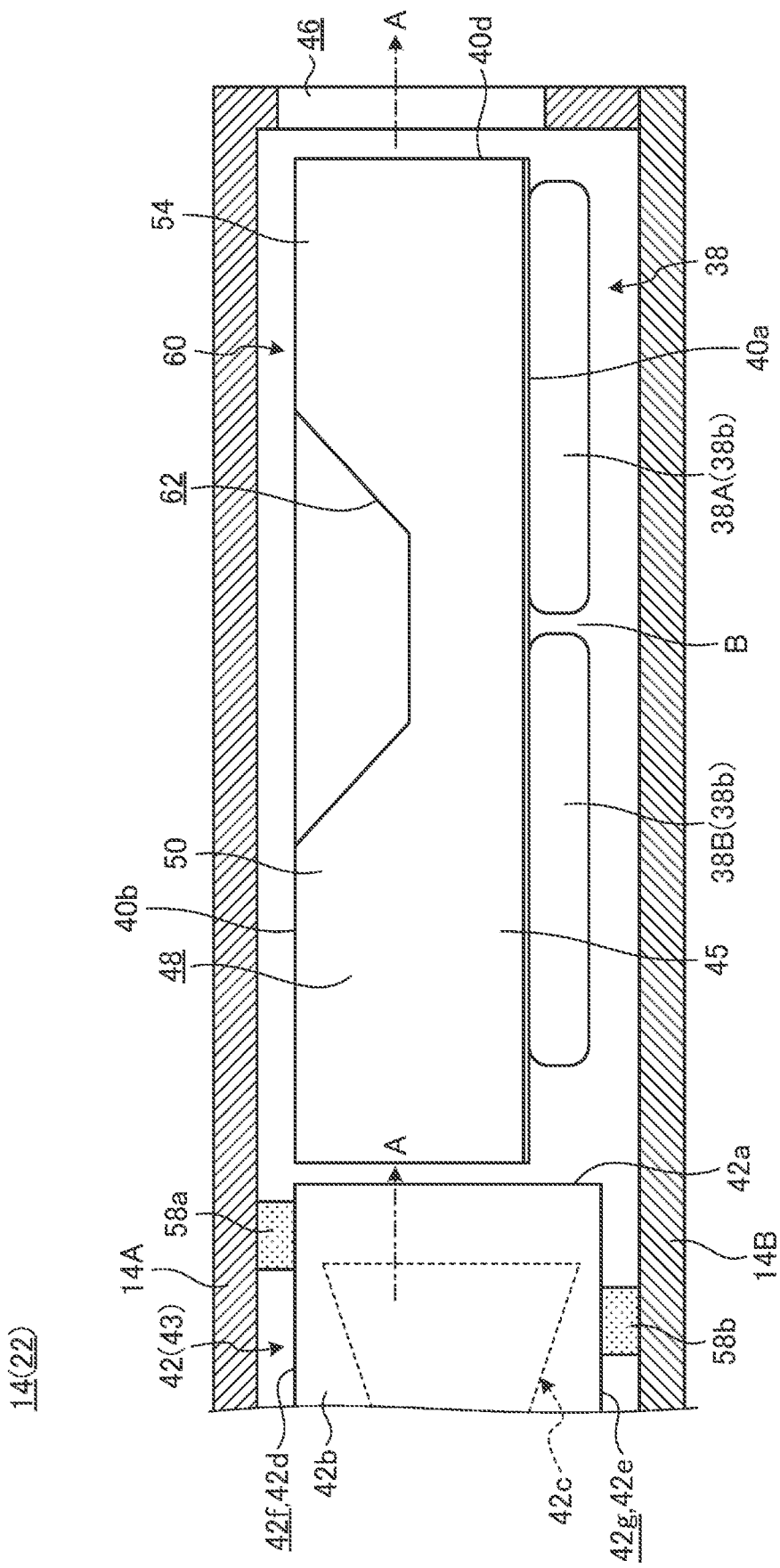
FIG. 6 is an enlarged side sectional view of a heat sink and a peripheral portion thereof according to a modification example.

FIG. 6 is an enlarged side sectional view of a heat sink 60 and a peripheral portion thereof according to a modification example. In FIG. 6, since the same reference numerals as the reference numerals illustrated in FIGS. 1 to 5 indicate the same or similar configurations, the same or similar functions and effects are achieved, and detailed description thereof will be omitted.

Compared with the heat sink 40 (41), the heat sink 60 illustrated in FIG. 6 is not provided with the notch portion 48 and includes a valley portion 62 instead of the valley portion 52. The valley portion 62 has a larger notch volume than the valley portion 52. The valley portion 62 is formed in, for example, a substantially mortar as viewed from the side. The shape of the valley portion 62 may be the same as or similar to the shape of the valley portion 52.

Also, in the heat sink 60, as viewed in a direction in which the heat pipes 38A and 38B are laminated, the valley portion 62 is disposed at a position overlapping the boundary portion B of the heat pipes 38A and 38B. That is, the mountain portions 50 and 54 of the heat sink 60 are also disposed at the positions vertically overlapping the heat pipes 38A and 38B, respectively. Therefore, also in the heat sink 60, the decrease in the heat transfer efficiency from the two heat pipes 38A and 38B to each of the pins 45 can be avoided while reducing the surface area of the fin 45 and reducing the ventilation resistance, and high heat exhausting capacity can be obtained.

As described above, the notch portion 48 may be omitted. It should be noted that, the notch portion 48 is disposed immediately behind the exhaust port 42a of the fan 42 (43), and has a larger influence on the ventilation resistance of the entire heat sink than the valley portions 52 and 62. Therefore, in the configuration in which the notch portion 48 is provided as in the heat sink 40 (41), even in a case in which the notch volume of the valley portion 52 is minimized, the ventilation resistance of the entire heat sink can be sufficiently reduced by a synergistic effect with the effect of reducing the ventilation resistance in the notch portion 48. As a result, the heat sink 40 (41) provided with the notch portion 48 and the valley portion 52 has an advantage that the ventilation resistance thereof can be reduced while ensuring a large surface area of the fin 45.

In addition, the present invention is not limited to the above-described embodiment, and there is no doubt that the present invention can be freely changed without departing from the gist of the present invention.

The invention claimed is:

1. A cooling module mounted on an electronic apparatus, the cooling module comprising:
    a fan including an intake port and an exhaust port;
    a heat sink including a plurality of fins arranged with a gap between the fins, and an air introduction surface with an air exhaust surface that intersects a bottom most surface of the heat sink on one side and a top most surface of the heat sink on another side, wherein the air introduction surface faces the exhaust port; and
    a first heat pipe and a second heat pipe that are connected to the bottom most surface of the heat sink and are arranged along a flow direction of air in the heat sink from the air introduction surface toward the air exhaust surface,
    wherein the heat sink includes:
        a valley portion in which the second surface is recessed toward a side of the bottom most surface,
        a first mountain portion that is between the valley portion and the air introduction surface and has a height greater than a height of the valley portion, and
        a second mountain portion that is between the valley portion and the air exhaust surface and has a height greater than the height of the valley portion, and
        the first mountain portion only overlaps the first heat pipe as between the first and second heat pipes, and the second mountain portion only overlaps the second heat pipe as between the first and second heat pipes;
    wherein the first and second heat pipes are entirely external of all the plurality of fins and disposed at the bottom most surface of the heat sink.

2. The cooling module according to claim 1,
    wherein, the valley portion overlaps a boundary portion between the first heat pipe and the second heat pipe.

3. The cooling module according to claim 1,
    wherein the heat sink further includes a notch portion that is upstream, in terms of the air flow direction, of the first mountain portion and is configured such that a corner portion of the plurality of fins between the air introduction surface and the top most surface is notched.

4. The cooling module according to claim 1,
wherein the heat sink further includes a cover member on the top most surface and closes an opening of the valley portion.

5. A cooling module mounted on an electronic apparatus, the cooling module comprising:
- a fan including an intake port and an exhaust port;
- a heat sink including a plurality of fins arranged with a gap between the fins, and an air introduction surface with an air exhaust surface that intersect a bottom most surface of the heat sink on one side and a top most surface of the heat sink on another side, wherein the air introduction surface faces the exhaust port; and
- a first heat pipe and a second heat pipe that are connected to the bottom most surface of the heat sink and are arranged along a flow direction of air in the heat sink from the air introduction surface toward the air exhaust surface, wherein the heat sink includes:
- a notch portion that is configured such that a corner portion of the fin between the air introduction surface and the top most surface is notched,
- a valley portion that overlaps a boundary line between the first heat pipe and the second heat pipe, wherein the plurality of fins is recessed in a valley shape from a side of the top most surface toward a side of the bottom most surface;

wherein the first and second heat pipes are entirely external of all the plurality of fins and disposed at the bottom most surface of the heat sink.

6. The cooling module according to claim 5,
wherein the heat sink further includes:
- the first mountain portion is between the notch portion and the valley portion, and has a height greater than a height of the valley portion, and
- the second mountain portion is between the valley portion and the air exhaust surface, and has a height greater than the height of the valley portion.

7. An electronic apparatus comprising:
- a chassis;
- a heating element in the chassis; and
- a cooling module in the chassis and that absorbs heat generated by the heating element, wherein the cooling module includes:
- a fan including an intake port and an exhaust port,
- a heat sink including a plurality of fins arranged with a gap between the fins, and an air introduction surface with an air exhaust surface that intersects a bottom most surface of the heat sink on one side and a top most surface of the heat sink on another side, wherein the air introduction surface faces the exhaust port, and
- a first heat pipe and a second heat pipe that are connected to the bottom most surface of the heat sink and are arranged along a flow direction of air in the heat sink from the air introduction surface toward the air exhaust surface, the heat sink includes:
- a valley portion in which the second surface is recessed toward a side of the first surface,
- a first mountain portion that is between the valley portion and the air introduction surface and has a height greater than a height of the valley portion, and
- a second mountain portion that is between the valley portion and the air exhaust surface and has a height greater than the height of the valley portion, and
- the first mountain portion overlaps the first heat pipe, and the second mountain portion overlaps the second heat pipe;

wherein the first and second heat pipes are entirely external of all the plurality of fins and disposed at the bottom most surface of the heat sink.

* * * * *